(12) United States Patent
Lee

(10) Patent No.: US 7,932,001 B2
(45) Date of Patent: Apr. 26, 2011

(54) METHOD OF FABRICATING HALFTONE PHASE SHIFT MASK

(75) Inventor: Hye Mi Lee, Gwangju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 125 days.

(21) Appl. No.: 12/347,054

(22) Filed: Dec. 31, 2008

(65) Prior Publication Data
US 2009/0253053 A1    Oct. 8, 2009

(30) Foreign Application Priority Data
Apr. 7, 2008    (KR) .................. 10-2008-0032289

(51) Int. Cl.
*G03F 1/00* (2006.01)
(52) U.S. Cl. ............................................ 430/5; 430/322
(58) Field of Classification Search ........... 430/5, 270.1, 430/322–326
See application file for complete search history.

(56) References Cited

U.S. PATENT DOCUMENTS

| | | | |
|---|---|---|---|
| 5,464,712 A * | 11/1995 | Han ................................ | 430/5 |
| 5,538,816 A | 7/1996 | Hashimoto et al. | |
| 5,738,959 A | 4/1998 | Miyashita et al. | |
| 5,916,712 A | 6/1999 | Miyashita et al. | |
| 2006/0257752 A1* | 11/2006 | Kim et al. .................. | 430/5 |

FOREIGN PATENT DOCUMENTS

| | | |
|---|---|---|
| JP | 2002-156764 | 5/2002 |
| KR | 10-1996-0015788 | 11/1996 |
| KR | 10-2007-0100572 | 10/2007 |

* cited by examiner

*Primary Examiner* — Stephen Rosasco
*Assistant Examiner* — Stewart A Fraser
(74) *Attorney, Agent, or Firm* — Marshall, Gerstein & Borun LLP

(57) ABSTRACT

A method of fabricating a halftone phase shift mask, comprising: forming a structure by sequentially stacking a light blocking layer pattern defining a side surface and a phase shift layer pattern over a light transmitting substrate; and treating the structure with heat to make the phase shift layer pattern flow and cover the side surface of the light blocking layer pattern.

6 Claims, 3 Drawing Sheets

METHOD OF FABRICATING HALFTONE PHASE SHIFT MASK

CROSS-REFERENCE TO RELATED APPLICATIONS

Priority to Korean patent application number 10-2008-0032289 filed on Apr. 7, 2008, the entire disclosure of which is incorporated by reference, is claimed.

BACKGROUND OF THE INVENTION

The invention relates generally to a method of fabricating a photomask and, more particularly, to a method of fabricating a halftone phase shift mask.

A semiconductor device is realized through various patterns on a wafer, and these patterns are generally formed through a photolithography process. According to a conventional photolithography process, a photoresist layer is formed on a layer to be patterned on a wafer and a predetermined portion is exposed using a photomask. Next, a photoresist layer pattern that exposes some of a surface of the layer to be patterned is formed by removing a portion of the photoresist layer, the solubility of which is changed or unchanged by the exposure, with a development process using a developing solution. Then, a pattern is formed by removing the exposed portion of the layer to be patterned with an etch process using the photoresist layer pattern as an etch mask. In this procedure, the pattern formed on the wafer is defined by the photoresist layer pattern and the photoresist layer pattern is formed as the pattern on the photomask is transferred thereto. Therefore, the pattern on the photomask layer is consequently transferred to the pattern on the wafer.

There are various kinds of photomasks, but a binary mask and a phase shift mask are widely used. The binary mask is easy to fabricate but has a limitation that it is difficult to transfer an image thereof onto a wafer when forming fine patterns. On the other hand, the phase shift mask causes a phase difference between light transmitted through a phase shift layer and light transmitted through a portion having no phase shift layer and generates destructive interference at an interface of the patterns by this phase difference, thereby representing relatively high resolution. Therefore, the phase shift mask is much more widely used as compared to the binary mask.

However, as the degree of integration of semiconductor devices increases, the design rule of the phase shift mask has also been reduced, and accordingly, the space between the patterns of the phase shift mask, i.e. the pattern pitch, has also been reduced. Due to this tendency, it becomes gradually more difficult to form the required fine pattern pitch of the phase shift mask. For example, while performing an electron beam exposure process, a development process, and an etch process, errors resulting from inaccuracies in patterns defined by an electron beam exposure apparatus, reactivity between a developing solution and a resist layer, or inaccuracies in the etch process are amplified, and the "Mean To Target" (MTT) consequently increases. Therefore, has become difficult to obtain a fine pattern pitch due to the gradually increasing MTT.

SUMMARY OF THE INVENTION

Embodiments of the invention are directed to a method of fabricating a halftone phase shift mask capable of maintaining high resolution as well as forming a fine pattern pitch.

In one embodiment, a method of fabricating a halftone phase shift mask comprises: forming a structure by sequentially stacking a light blocking layer pattern defining a side surface and a phase shift layer pattern over a light transmitting substrate; and treating the structure with heat to make the phase shift layer pattern flow and cover the side surface of the light blocking layer pattern.

The heat treatment is preferably performed in a furnace.

In the case where the heat treatment is performed in a furnace, the temperature of the furnace is preferably maintained at no greater than 1400° C.

The light blocking layer pattern and the phase shift layer pattern are preferably sequentially stacked over the light transmitting substrate by: forming a light blocking layer and a phase shift layer over the light transmitting substrate; and sequentially removing exposed portions of the light blocking layer and the phase shift layer by an etch process using a resist layer pattern.

The light transmitting substrate preferably comprises quartz, the light blocking layer preferably comprises chrome, and the phase shift layer preferably comprises molybdenum silicon nitride.

According to the invention, since a phase shift mask is formed through flow of a phase shift layer, it is possible to obtain a fine pattern pitch of a desired profile regardless of an error in electron beam exposure, development, and etch processes, and, more particularly, to facilitate forming of a circular pattern.

DESCRIPTION OF SPECIFIC EMBODIMENTS

Hereinafter, a method of fabricating a halftone phase shift mask in accordance with the invention will be described in detail with reference to the accompanying drawings.

FIGS. 1 through 5 illustrate a method of fabricating a halftone phase shift mask according to an embodiment of the invention. First, referring to FIG. 1, a light blocking layer 110 is formed over a light transmitting substrate 100, such as quartz, for example. The light blocking layer 110 is preferably but not necessarily formed of chrome (Cr). Next, a phase shift layer 120 is formed over the light blocking layer 110. The phase shift layer 120 is preferably formed of a material having a light transmittance of about 6% to 8%, for example, a molybdenum silicon nitride (MoSiN) layer or a molybdenum silicon oxynitride (MoSiON) layer. Next, a resist layer 130 is formed over the phase shift layer 120.

Figure 1:
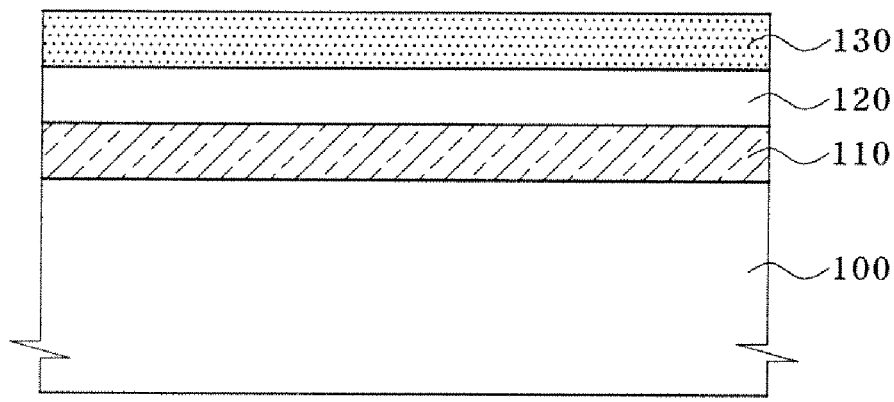
FIGS. 1 through 5 illustrate a method of fabricating a halftone phase shift mask according to an embodiment of the invention.
Figure 2:
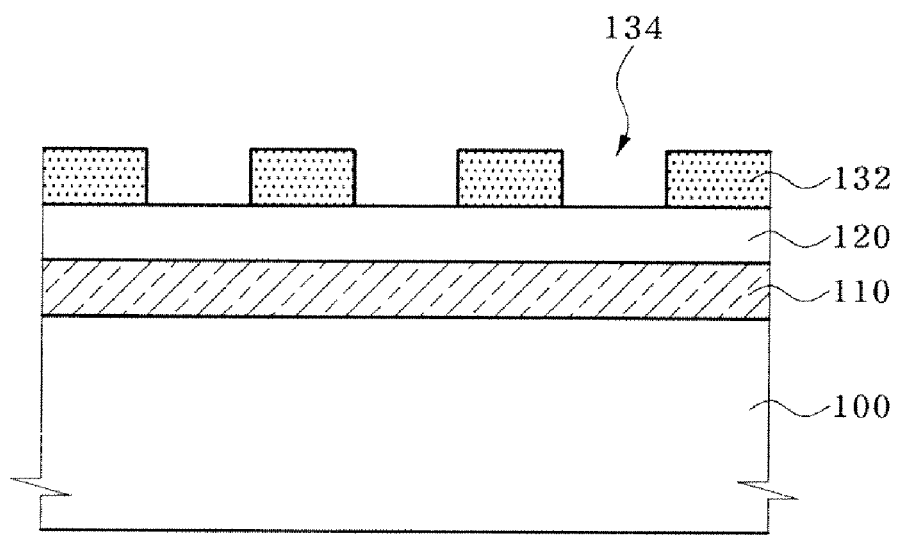

Next, referring to FIG. 2, an electron beam exposure process is performed on the resist layer (130 in FIG. 1). A laser beam exposure may be performed instead of the electron beam exposure, if desired. Next, a resist layer pattern 132 is formed by performing a development process on the resist layer 130 having undergone the exposure. The resist layer pattern 132 has an opening 134 and some surface of the phase shift layer 120 is exposed by the opening 134.

Figure 3:
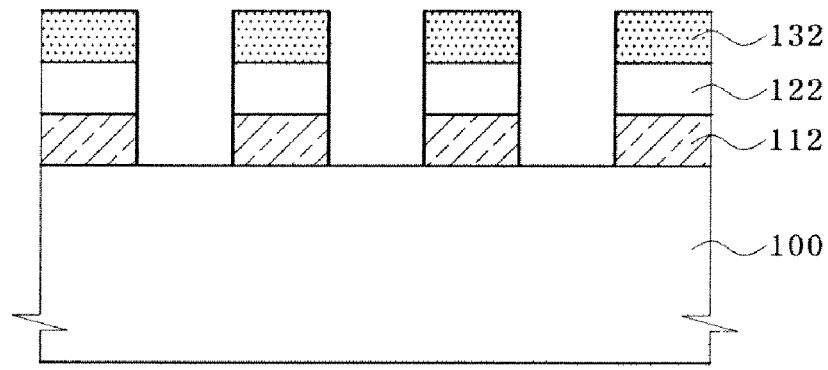

Next, referring to FIG. 3, an exposed portion of the phase shift layer (120 in FIG. 2) is removed by performing an etch process using the resist layer pattern 132 as an etch mask. The etch process is preferably performed using a dry etch method. By this etch process, a phase shift layer pattern 122 that exposes some surface of the light blocking layer (110 in FIG. 2) is formed. By continuously etching the exposed portion of the light blocking layer 110, a light blocking layer pattern 112 that exposes some surface of the light transmitting substrate 100 is formed. After the phase shift layer pattern 122 and the light blocking layer pattern 112 are formed, the resist layer 132 is removed.

Figure 4:
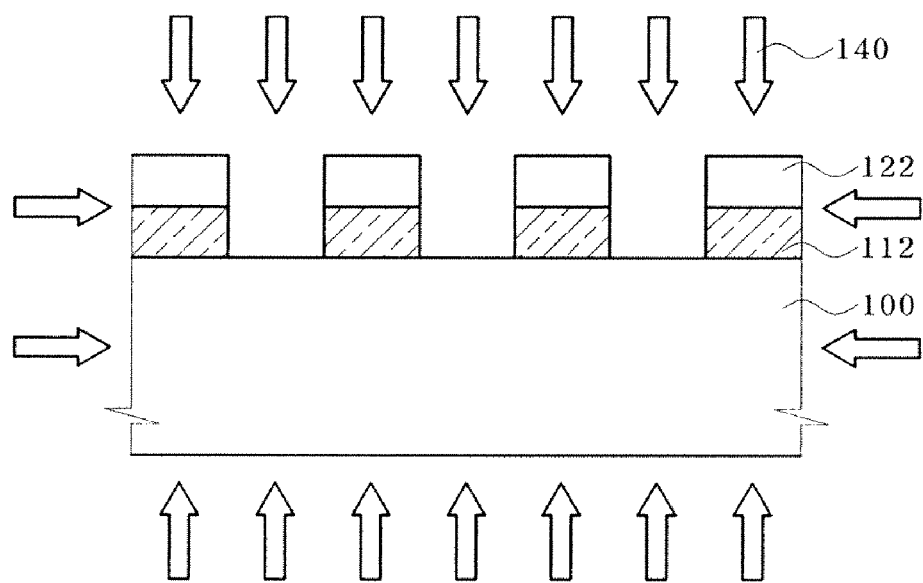

Next, referring to FIG. 4, after the light blocking layer pattern 112 and the phase shift layer pattern 122 have been sequentially disposed over the light transmitting substrate 100, heat treatment to make the phase shift layer pattern 122 flow is performed, as shown by arrows 140. This heat treatment is preferably performed in a furnace. Since the purpose of the heat treatment is to make the phase shift layer pattern 122 flow, the heat treatment is performed at a temperature below a melting point of Si, for example 1414° C., which has the lowest melting point of materials constituting the phase shift layer pattern 122, i.e. at a temperature of 1400° C.

In thermal conductivity of respective components constituting a photomask upon the heat treatment in the furnace, the thermal conductivity of chrome is 0.16, molybdenum 0.35, and silicon 0.20. Therefore, the phase shift layer pattern 122 and the light transmitting substrate 100 including the molybdenum and the silicon are relatively more influenced by an atmosphere in the furnace compared to the light blocking layer pattern 122 made of chrome. However, the quartz constituting the light transmitting substrate 100 has high thermal resistance to rapid heating or rapid cooling and is not influenced by a high temperature, i.e., a temperature greater than 1100° C. Therefore, the patterns are not changed by other factors except the flowing of the phase shift layer pattern 122 under temperature conditions of less than about 1400° C.

Figure 5:
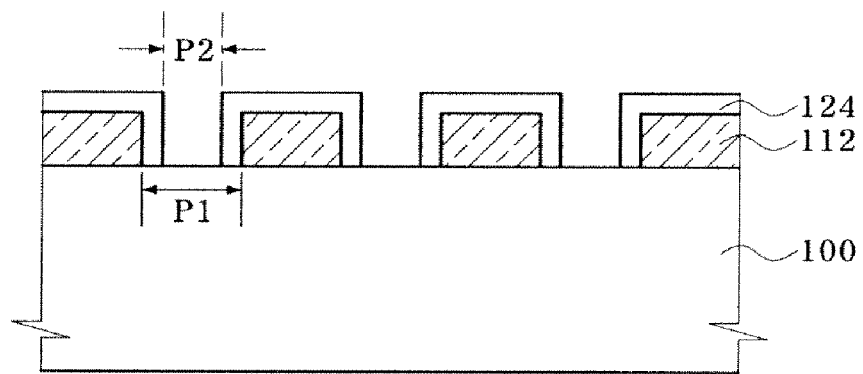

Next, referring to FIG. 5, the phase shift layer pattern 122 (122 in FIG. 4) flows due to the heat treatment, and a phase shift layer pattern 124 that surrounds the light blocking layer pattern 112 is thereby formed. At this time, since the flowing of the phase shift layer pattern 122 by the heat treatment is performed in every direction without a specific directivity, the flowed phase shift layer pattern 124 has a circular form. A pattern pitch P2 after the flowed phase shift layer pattern 124 is formed is reduced compared to the pattern pitch P1 by the phase shift layer pattern 122 before heat treatment. The reduction ratio may be controlled by adjusting flowing amount of the phase shift pattern 122 with control of heat treatment temperature and heat treatment time.

Figure 6:
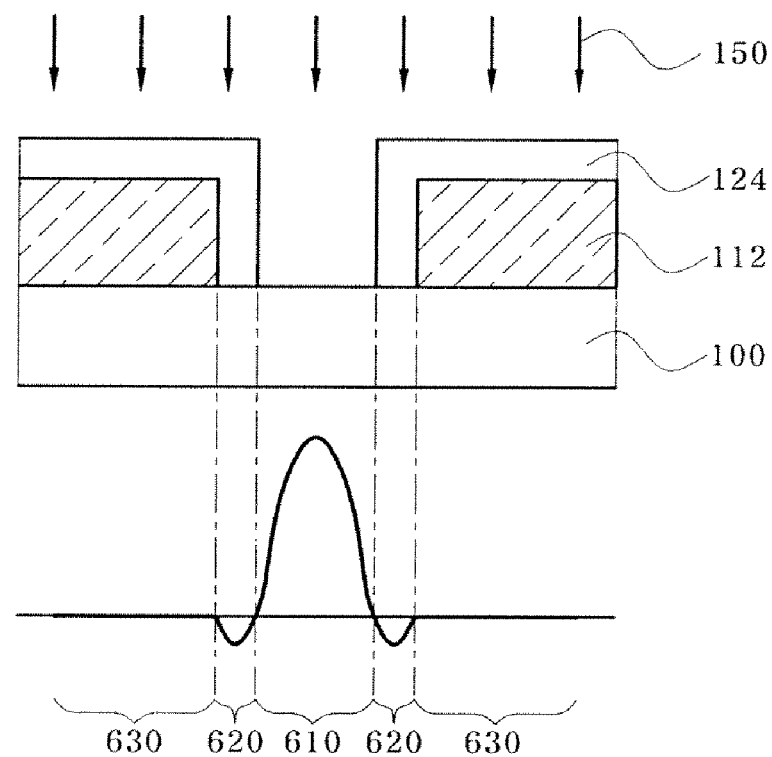
FIG. 6 illustrates operation of a halftone phase shift mask manufactured according to the invention.

FIG. 6 illustrates an operation of a halftone phase shift mask manufactured according to the invention. Referring to FIG. 6, when light is irradiated to and transmitted through the halftone phase shift mask according to the invention as shown by arrows 150, light having the same phase as the light irradiated is transmitted to an exposed portion 610 of the light transmitting substrate 100 with a sufficient intensity as can be appreciated from a light intensity profile at a lower portion of the figure. Also, in a portion 620 in which the flowed phase shift layer pattern 124 is present, the light phase shifted 180 degrees from the irradiated light is transmitted by quantity of light corresponding to the light transmittance of the flowed phase shift layer pattern 124, for example, a light quantity of 6% to 8%. Therefore, a destructive interference is caused in the interface between the two portions 610 and 620 and the resolution is thus increased. Further, the light cannot be transmitted through the portion 630 in which the light blocking layer pattern 112 and generation of a ghost image resulted from that the light undesirably comes into a light blocking region is thus inhibited.

While the invention has been described with respect to the specific embodiments, various changes and modifications may be made without departing from the spirit and scope of the invention as defined in the following claims.

What is claimed is:

1. A method of fabricating a halftone phase shift mask, comprising:

forming a structure by sequentially stacking light blocking layer patterns, each light blocking layer pattern having opposed side surfaces, and phase shift layer patterns over a light transmitting substrate; and treating the structure with heat to make the phase shift layer patterns flow to cover the light blocking layer patterns including the opposed side surfaces of the light blocking layer patterns, wherein the light transmitting substrate is exposed in the area between each adjacent covered light blocking layer pattern.

2. The method of claim 1, comprising performing the heat treatment in a furnace.

3. The method of claim 2, wherein the temperature of the furnace is no greater than 1400° C.

4. The method of claim 1, comprising sequentially stacking the light blocking layer patterns and the phase shift layer patterns over the light transmitting substrate by:

forming a light blocking layer and a phase shift layer over the light transmitting substrate; and sequentially removing exposed portions of the light blocking layer and the phase shift layer by an etch process using resist layer patterns as a mask.

5. The method of claim 4, wherein the phase shift layer comprises a material having a light transmittance of about 6% to 8%.

6. The method of claim 4, wherein the light transmitting substrate comprises quartz, the light blocking layer comprises chrome, and the phase shift layer comprises a molybdenum silicon nitride or molybdenum silicon oxynitride (MoSiON).

* * * * *